United States Patent [19]

Ma

[11] Patent Number: 6,016,057
[45] Date of Patent: Jan. 18, 2000

[54] SYSTEM AND METHOD FOR IMPROVED WATER AND FAT SEPARATION USING A SET OF LOW RESOLUTION MR IMAGES

[75] Inventor: Jingfei Ma, Waukesha, Wis.

[73] Assignee: General Electric Company, Milwaukee, Wis.

[21] Appl. No.: 09/061,486

[22] Filed: Apr. 17, 1998

[51] Int. Cl.[7] ........................ G01V 3/00
[52] U.S. Cl. ............ 324/309; 324/307; 324/311
[58] Field of Search .................. 324/309, 307, 324/300, 311, 322

[56] References Cited

U.S. PATENT DOCUMENTS

| | | | |
|---|---|---|---|
| 4,661,775 | 4/1987 | Kormos et al. | 324/307 |
| 4,720,679 | 1/1988 | Patrick et al. | 324/309 |
| 5,134,372 | 7/1992 | Inoue | 324/309 |
| 5,144,235 | 9/1992 | Glover et al. | 324/309 |
| 5,162,737 | 11/1992 | Nozokido et al. | 324/309 |
| 5,225,781 | 7/1993 | Glover et al. | 324/309 |
| 5,273,040 | 12/1993 | Apicella et al. | 128/653.2 |
| 5,321,359 | 6/1994 | Schneider | 324/307 |
| 5,594,336 | 1/1997 | Gullapalli et al. | 324/309 |
| 5,627,469 | 5/1997 | Hong et al. | 324/309 |
| 5,909,119 | 6/1999 | Zhang et al. | 324/309 |

OTHER PUBLICATIONS

R. E. Sepponen, J. T. Sepponen, and J. I. Tanttu, A Method for Chemical Shift Imaging: Demonstration of Bone Marrow Involvement with Proton Chemical Shift Imaging, *JCAT*, 8,585 (1984).

H. N. Yeung and D. W. Kormos, Separation of True Fat and Water Images by Correcting Magnetic Field Inhomogeneity in Situ, *Radiology* 159, 783 (1986).

G. H. Glover, Multipoint Dixon Technique for Water and Fat Proton and Susceptibility Imaging, *JMRI*, 1, 521 (1991).

G. H. Glover and E. Schneider, Three–point Dixon Technique for True Water/Fat Decomposition with Bo Inhomogeneity Correction, *MRM*, 18, 371–383 (1991).

Q. S. Xiang, L. An, D. Aikins and A. L. MacKay, Phase Correction in Two–Point Dixon Chemical Shift Imaging, *Third ISMRM*, 1904, 1995, Nice, France.

(List continued on next page.)

*Primary Examiner*—Christine K. Oda
*Assistant Examiner*—Brij B. Shrivastav
*Attorney, Agent, or Firm*—Timothy J. Ziolkowski; Christian G. Cabou; Phyllis Y. Price

[57] ABSTRACT

A system and method for improved water and fat separation in magnetic resonance imaging (MRI) is disclosed using a set of low-resolution images to correct phase errors with overall reduced scan time and post-processing time and enhanced reliability. Several embodiments are disclosed whereby reliable water and fat separation is achieved in nearly one NEX, Two NEX, or Three NEX regular imaging times. In the one embodiment, a regular image data set having water and fat phase-shifted by 90° is acquired, along with two low-resolution image data sets where water and fat are phase-shifted by 0° and 180° are acquired. In another embodiment, two regular image data sets having water and fat phase-shifted by 0° and 180° are acquired, and a low-resolution imaging data set having water and fat phase-shifted by 90° is acquired. In post-processing, three low-resolution images are reconstructed and the phase factors for all the pixels with appreciable amounts of both water and fat are determined. For pixels with a single spectral component or low SNR, phase factors are obtained in a region-growing process designed specifically to ensure spatial phase continuity. Once the low-resolution phase factors are available, they are used either for correcting the phase errors in the regular image in the One NEX embodiment, or for guiding a binary choice between two possible solutions from the two regular images in the Two NEX embodiment. Other embodiments are also disclosed herein besides a reduction in scan time, the image processing time is also reduced in the proposed technique due to the use of images with reduced matrix size, increased SNR, and fewer pixels with single spectral component.

33 Claims, 4 Drawing Sheets

OTHER PUBLICATIONS

Q. S. Xiang and L. An, Water/Fat Imaging with Direct Phase Encoding, *Third ISMRM*, 658, 1995, Nice, France.

Q. S. Xiang, and L. An, General 3–point Water/Fat Imaging with Optimized SNR, *Fourth ISMRM*, 1544, 1996, New York.

E. M. Akkerman, and M. Maas, A region–growing algorithm to simultaneously remove dephasing influences and separate fat and water in two–point Dixon imaging. *Third ISMRM*, 649, 1995, Nice, France.

L. An and Q. S. Xiang, Quadrature 2–point Water–Fat Imaging, *Fourth ISMRM*, 1541, 1996, New York.

Z. Paltiel, Separate Water and Lipids Images Obtained by a Single Scan, *Fourth SMRM*, 172, 1985.

J. L. Patrick, E. M. Haacke, and J. E. Hahn, Water/fat Separation and Chemical Shift Artifact Correction Using a Single Scan, *Fourth SMRM*, 174, 1985.

SYSTEM AND METHOD FOR IMPROVED WATER AND FAT SEPARATION USING A SET OF LOW RESOLUTION MR IMAGES

BACKGROUND OF THE INVENTION

The present invention relates generally to magnetic resonance imaging (MRI), and more particularly to a system and method for improved water and fat separation using a set of low-resolution MR images to correct phase errors with overall reduced scan time and processing time and enhanced reliability.

Fat-suppression in MR imaging is useful for improved image contrast in regions containing adipose tissues. Areas of applications of the fat-suppression include, but are not limited to, imaging of cartilage, optical nerves, breast, liver and adrenal masses. In addition, quantitation of the relative contents of water and fat, which requires both water and fat images, can be valuable for diagnosing bone marrow diseases and for characterizing atherosclerotic plagues.

In a clinical environment, fat-suppression is currently performed mainly with two techniques, namely Chemical Saturation (ChemSat) and Short TI Inversion Recovery (STIR). However, both require an additional RF pulse applied before the regular imaging sequence and each has fundamental limitations. In ChemSat, fat-suppression is achieved by applying an excitation pulse with a narrow frequency-bandwidth, followed by spoiling gradients. As such, this method is intrinsically sensitive to magnetic field $B_0$ inhomogeneity. In STIR, the additional RF pulse applied is a 180° inversion pulse with the inversion period TI set to the fat nulling time (TI=$T_1$ In2, where $T_1$ is the longitudinal relaxation time of fat). Although STIR is less sensitive to magnetic field $B_0$ inhomogeneity, it alters the normal image contrast, lowers the overall image signal-to-noise ration (SNR), and sometimes becomes useless because it also suppresses the signals from water with a similarly short longitudinal relaxation time.

Another approach for fat-suppression is commonly referred to as the Dixon technique and involves obtaining a first image, for which water and fat magnetization vectors are parallel, and a second image, for which the two vectors are anti-parallel. Summation of these two images in the complex form yields a water-only image, and subtraction of the two images yields a fat-only image. Unfortunately, such simple treatment also breaks down in the presence of field inhomogeneities. The fundamental challenge for the Dixon-type technique lies in correcting the various phase errors of the complex images. It was later recognized that the field inhomogeneity-induced errors can, at least in principle, be corrected through modified data acquisitions and image reconstruction algorithms. Because of the promise of this technique, several variations to the original Dixon technique were developed. Typically, more data acquisition and more sophisticated reconstruction algorithms were used before the image summation and subtraction. Despite these efforts, the so-called Dixon techniques have not acquired widespread commercial acceptance. The major disadvantages of these techniques are that they generally require long imaging time because of multiple data acquisitions, and the algorithms used for correcting the phase errors are too time-consuming for on-line implementation. Further, these algorithms often lack the robustness for general clinical use and sometimes require manual intervention.

It would therefore be desirable to have a system and method for water and fat separation in an MRI that can be accomplished in a clinical setting with shorter overall scan times and enhanced reliability.

SUMMARY OF THE INVENTION

The present invention provides a system and method that allows for reliable water and fat separation in significantly reduced imaging and reconstruction times. The invention is based on the fact that although phase errors in actual MR images may be large over the entire image field-of-view (FOV), generally they vary slowly and smoothly on the image pixel scale. Therefore, phase-error correction can be achieved with low-resolution images which have a higher signal-to-noise ration (SNR) and can be collected within a reduced imaging time. Asymmetric sampling schemes can then be used for an overall decrease in the image processing time while increasing the robustness of the necessary phase correction procedures. This is possible because of the reduced matrix size, higher SNR, and more pixels containing both water and fat for which water and fat separation can be achieved directly on a pixel basis in this asymmetric sampling scheme.

The present invention has been tested on a series of whole body scanners and resulted in clean in vivo water and fat separation using data collected within an imaging time nearly as short as that for a regular one NEX (excitation number) image. As with the prior art Dixon techniques, the present invention is compatible with virtually all pulse sequence schemes, including spin echo, gradient-recalled echo, and fast spin echo.

Since the present invention is an improvement over the so called Dixon technique, a further explanation of this prior art method is described in more detail in U.S. Pat. No. 5,321,359 issued to Schneider and U.S. Pat. No. 5,144,235 issued to Glover, et al., both assigned to the same assignee of the present application and hereby incorporated by reference.

In accordance with one aspect of the invention, a system and method for MR imaging is disclosed for improving water and fat separation including the steps of obtaining at least three MR image data sets, for which the echo times are appropriately offset so that the water and fat magnetization vectors have a relative phase of 0, α2α, respectively, where α≠180°. The three data sets each contain central parts of the k-space, which are used for phase error corrections. At a minimum, one of the data set should also contain the outer part of the k-space so that a regular image can be reconstructed. The outer k-space data for another one or two sets of data can also be collected for increased signal-to-noise ratio (SNR) in the final image.

In accordance with another aspect of the invention, a system and method for MR imaging is disclosed for improving water and fat separation including the steps of obtaining at least three MR image data sets, wherein two of the MR image data sets are obtained at a first image resolution, and a third MR image data set is obtained at another image resolution. At least one of the MRI data sets is acquired at an image resolution that is higher than the image resolution of at least one other MRI data set. The higher resolution data set provides a regular matrix size image. For example, a regular image may have 256×256 pixels. The three MRI data sets are used to construct three low-resolution images, which in turn are used to create a low-resolution phase factor map to correct phase errors in the regular matrix size image provided by the MRI data set obtained at the higher image resolution.

The previous general description incorporates at least three embodiments of the invention whereby reliable water and fat separation is achieved in approximately the time of a regular 1 NEX, 2 NEX, or 3 NEX imaging. In one embodiment, only one regular image data set is acquired for which the water and fat vectors are phase shifted by 90°. Two further image data sets are acquired, but at a lower resolution and for which the water and fat vectors are phase shifted by 0° and 180°, respectively. In the another embodiment, two regular, full resolution image data sets are acquired where the water and fat vectors are phase shifted by 0° and 180°, respectively, and a single low-resolution image data set is acquired where the water and fact vectors are phase shifted by 90°. In yet another embodiment, all three data sets are collected at the full resolution. In each of the embodiments, three low-resolution images are reconstructed in post-processing and the phase factors for the pixel having appreciable amounts of both water and fat are determined directly on a pixel by pixel basis. For pixels with a single spectral component or low SNR, phase factors are obtained in a region-growing process designed specifically to insure spatial phase continuity. Once the low-resolution phase factors are available, they are used either for correcting the phase errors in the single regular, full resolution image, or are used for guiding a binary choice between two possible solutions from the two or three regular, full resolution image embodiments.

Besides reduction in scan times in certain embodiments, the image processing time is also reduced in the present invention due to the use of images with reduced matrix size, increased SNR, and fewer pixels with single spectral computer. Further, the processing becomes more robust and reliable because noise effect is largely mitigated by the use of low-resolution, high SNR images.

Accordingly, one object of the present invention is to provide a method and system for improving reliable water and fat separation while reducing both the overall scan time and the post-processing time.

Various other features, objects and advantages of the present invention will be made apparent from the following detailed description and the drawings.

BRIEF DESCRIPTION OF THE DRAWING

The drawings illustrate the best mode presently contemplated for carrying out the invention.

In the drawings.

DETAILED DESCRIPTION OF THE INVENTION

Figure 1:
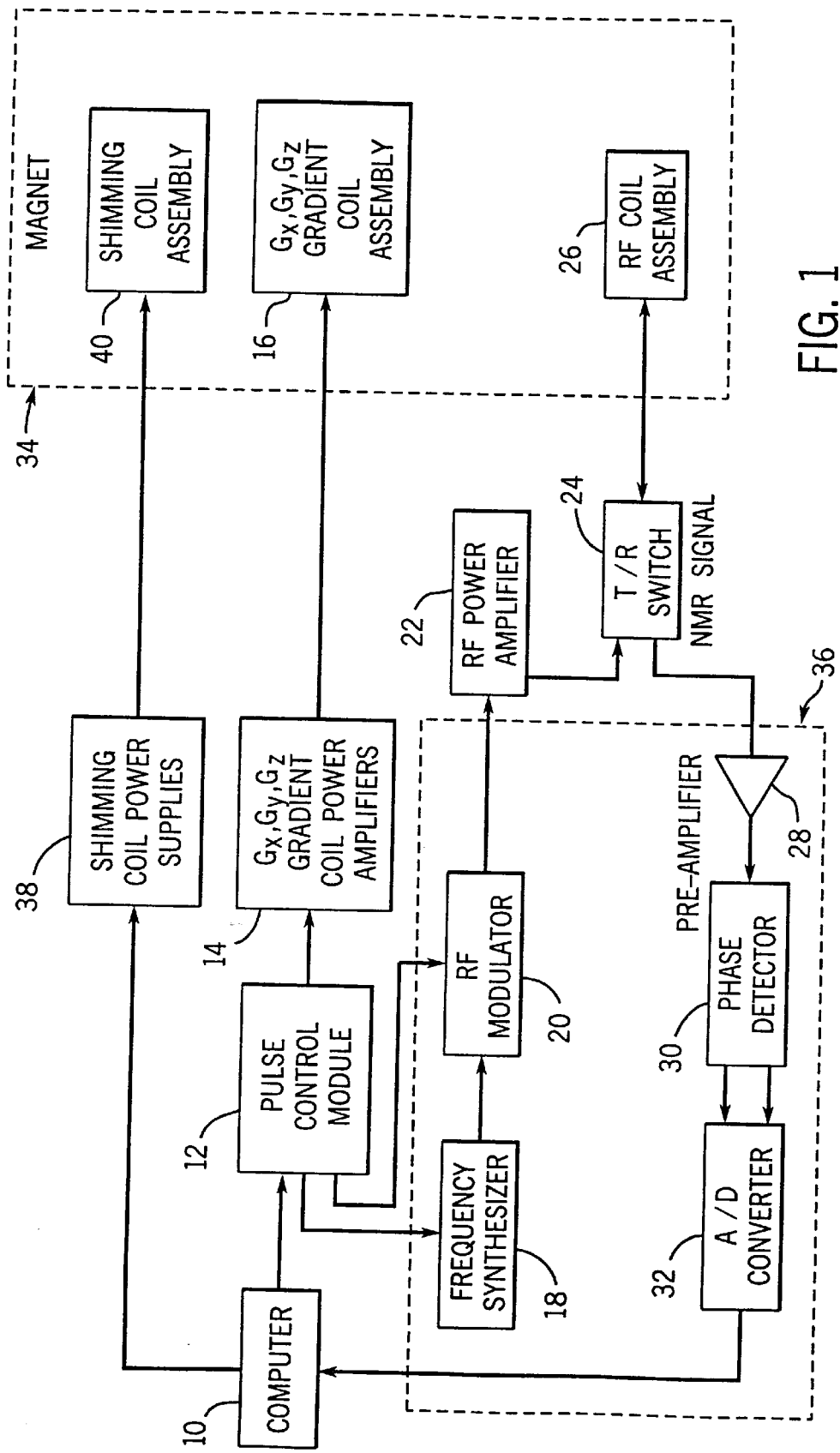
FIG. 1 is a schematic block diagram of one NMR imaging system usable with the present invention.

Referring to FIG. 1, an NMR imaging system of a type suitable for the practice of the invention includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16 which are positioned around the bore of the magnet 34 so that gradients Gs, Gy, and Gz are impressed along their respective axes on the polarizing magnetic field $B_0$ from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce NMR images of the object.

The present invention includes a method and system for use with the above referenced NMR system, or any similar system for obtaining MR images for improved water and fat separation in MR imaging. The system and method generally includes first obtaining at least three MR image data sets as shown and will be described in further detail with reference to FIGS. 2–4. The three data sets will be used to reconstruct a series of regular resolution and low-resolution images to produce the final water and fat images. For illustrative purposes, the regular resolution refers to a matrix size of 256×256 and the low-resolution refers to a matrix size of 64×64. In practice, the exact matrix sizes may depend on applications and hardware limitations.

In one embodiment, two of the three MR image data sets are obtained at a first image resolution, and the third is obtained at another image resolution. At least one of the MR image data sets is acquired at an image resolution higher than the image resolution of at least one other MR image data set, and the higher image resolution is capable of providing a regular matrix size image. For example, in the current state of the art, a regular matrix size image is considered one with 256×256 pixels. However, one skilled in the art will readily recognize that the resolution chosen is a design choice, and the pixel parameters of a regular matrix image will likely increase with further advancements in technology. The present invention is not so limited. The method and system next includes constructing three low-resolution images from the three MR image data sets and then creating a low-resolution phase factor map from the three low-resolution images to correct phase errors in the regular matrix size image that was obtained at the higher image resolution.

In one embodiment of the invention, for example, the MR image data set obtained at the higher image resolution is acquired where the water and fat vectors are phase shifted by approximately 90°. The other two MR image data sets are acquired at the lower image resolution. One of the lower image resolution MR image data sets is acquired where the water and fat vectors are aligned, and the other is obtained where the water and fat vectors are phase shifted by approximately 180°.

In another embodiment of the invention, two of the three MR image data sets are obtained at the higher image resolution. One of the higher image resolution data sheets is acquired where the water and fat vectors are aligned and the other is acquired where the water and fat vectors are phase shifted by approximately 180°. The third MR image data set is acquired at a lower image resolution and where the water and fat vectors are phase shifted by approximately 90°.

This asymmetric sampling technique, where the water and fat magnetization vectors of at least one of the three sampling points are neither parallel nor anti-parallel, allows for direct selection and identification of water and fat without the need for the phase correction technique known as "unwrapping," as long as the relative phases of the two components are well defined. The problem with traditional phase unwrapping is it is unreliable and error-prone in the presence of image noise and artifacts. Moreover, at most, it allows for correct separation of the water and fat vectors, but it cannot identify which vector is water and which vector is fat after their separation.

Figure 2:
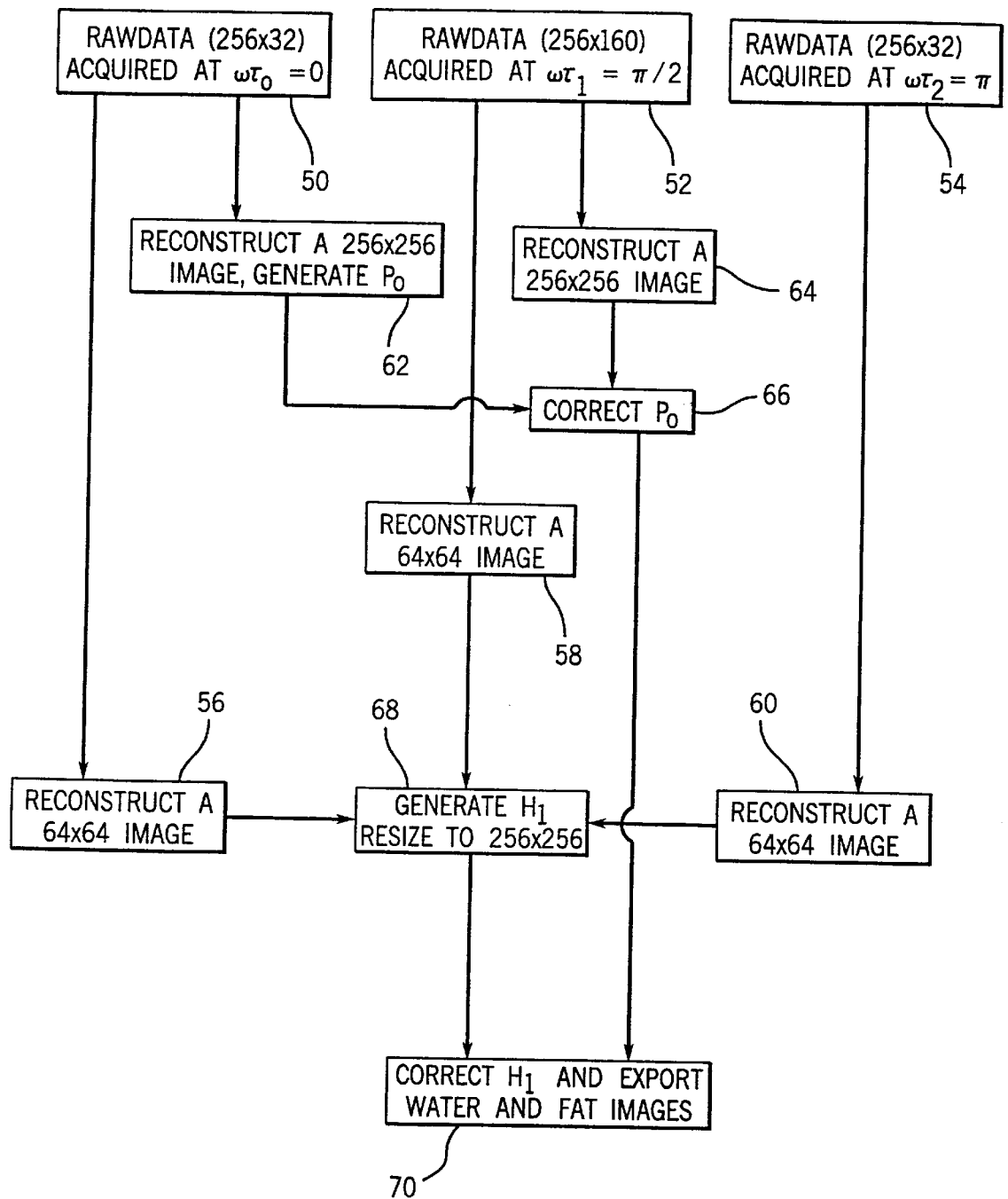
FIG. 2 is a flowchart of the processing steps in one embodiment of the present invention for water and fat separation.

Referring to FIG. 2, the data processing steps involved in a one NEX implementation for the water and fat separation will be described. First, the k-space data is acquired 50, 52 and 54. Two of the data acquisitions are at low-resolution 50, 54, and the other is at the higher resolution 52. One low-resolution data sample is taken where the fat and water vectors are in-phase 50. Another low-resolution data sample is taken where the water and fat vectors are 180° phase shifted 54, and the other data acquisition, which is taken at the higher resolution, is taken where the fat and water vectors are 90° phase shifted. Each of the data acquisitions 50, 52, and 54 are used to construct three low-resolution images 56, 58 and 60. In this case, the low-resolution images are 64×64 pixels. These three images are represented by $S_0$, $S_1$, and $S_2$ in Eqns. [9–11], which will be described hereinafter in the Theory section. A full resolution 256×256 image is constructed at 62 from the low-resolution data at 50 after zero-filling. This zero-filled full-resolution image is used to remove the constant phase error $P_0$ at 66 from the regular full-resolution image reconstructed at 64 from raw data at 52. The time dependent phase factor $H_1$ is generated at 68 with a region-growing technique and a boxcar average (law-pass filtering) technique using the three low-resolution images at 56, 58 and 60. The images of $H_1$ is then resized to a 256×256 matrix size and is smoothed using another boxcar average at 68. The smoothed $H_1$ image is then applied to the image at 66 and the final water and fat images are made available as the magnitude of the real and imaginary parts of the phase corrected image at 70.

Figure 3:
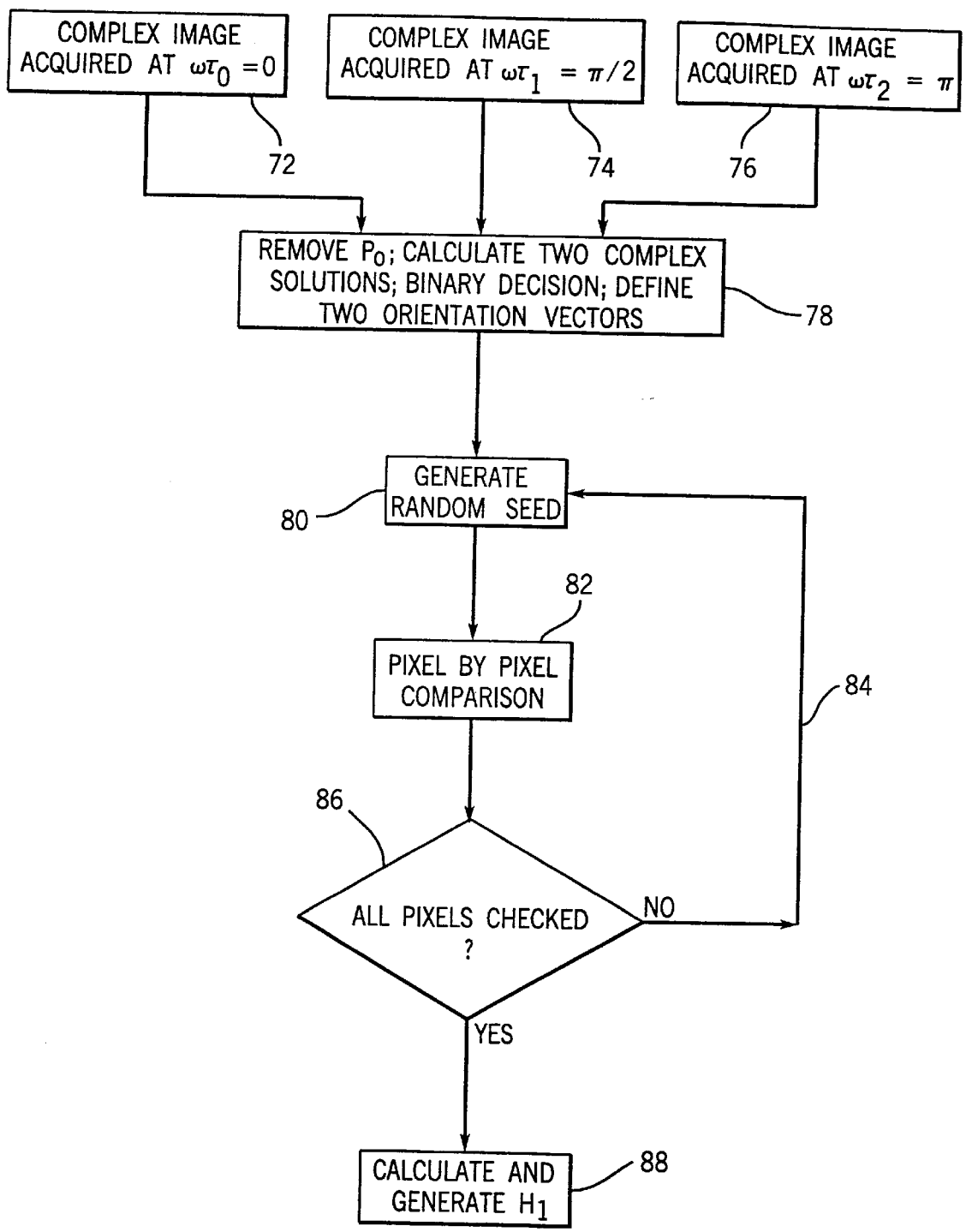
FIG. 3 is a flowchart showing one embodiment of the post-processing steps for phase error determinations according to one aspect of the present invention.

Referring to FIG. 3, the region-growing process for determining the phase factor $H_1$ associated with the field inhomogeneity is described. From the three complex images earlier acquired 72, 74, and 76, the phase factor $P_0$ is removed and two sets of complex solutions are calculated according to the later described Eqns. [14] and [15] at 78. A binary decision is then made according to the phase relationships, and if a single component exists, it is assigned to water, thereafter two orientation vectors are defined according to Eqn. [16], also in step 78. As later described, if the correct water and fat assignment is made, the orientation vector is equal to $(F+W)P_0H_1$, and this is parallel to $H_1$ since $(F+W)$ is a scaler and $P_0$ has been removed. If an incorrect assignment is made, the orientation vector would be equal to $i(F-W)P_0H_1$, thus it would deviate from $H_1$ by either 90° or −90°. To rectify possible wrong water and fat assignments at 78, a region-growing process can be designed to ensure phase continuity of the orientation vectors. Such a region growing process starts by generating a random seed at 80, and a pixel by pixel comparison is undertaken at 82. In the pixel by pixel comparison, the angular difference between the orientation vector of the seed and the two possible orientation vectors of every one of its four nearest neighboring pixels is compared. During this procedure, the fat/water assignment, and thus the orientation vectors, is reversed based on the neighboring pixel where necessary.

The grown pixels are then used as new seeds on a first in, first out basis. The growth into background noise is excluded by limiting the angles between the orientation vectors of the two neighboring pixels to within a preset threshold value (typically ±15°–20°). The possibility of starting with a seed with a wrong water/fat assignment is prevented by discarding a growing process that generates more reversals than one-reversals.

Vector orientation reversal is decided by a step-wise function. For this purpose, the angular difference between the orientation vector of the seed and the two possible orientation vectors of the nearest-neighboring pixel is calculated. Of the two possible orientation vectors of the nearest neighboring pixel, the one with the smaller angular difference is assigned as the correct orientation vector for that pixel. If this is a swap from the original assignment, the pixel will be marked as a "reversed" for the growth process, otherwise the pixel will be marked as "non-reversed." Subsequently, the smaller of the angular difference is checked with a pre-set threshold of ±15°–±20°. If it is within this range, the pixel will be stored into a stack of new seeds. If it is outside the range, the pixel will not be used as a new seed. The checking process stops when there are no further seed pixels left in the seed stack, or is aborted if during the process, more pixels are assigned "reversed" than are assigned "non-reversed."

This region-growing process is repeated, 84, until all of the pixels are checked 86, at which point an average orientation vector is calculated and compared with the orientation vector before the average, pixel assignment is reversed where necessary, and the new orientation vector is averaged and normalized to generate the phase factor $H_1$ at 88.

Figure 4:
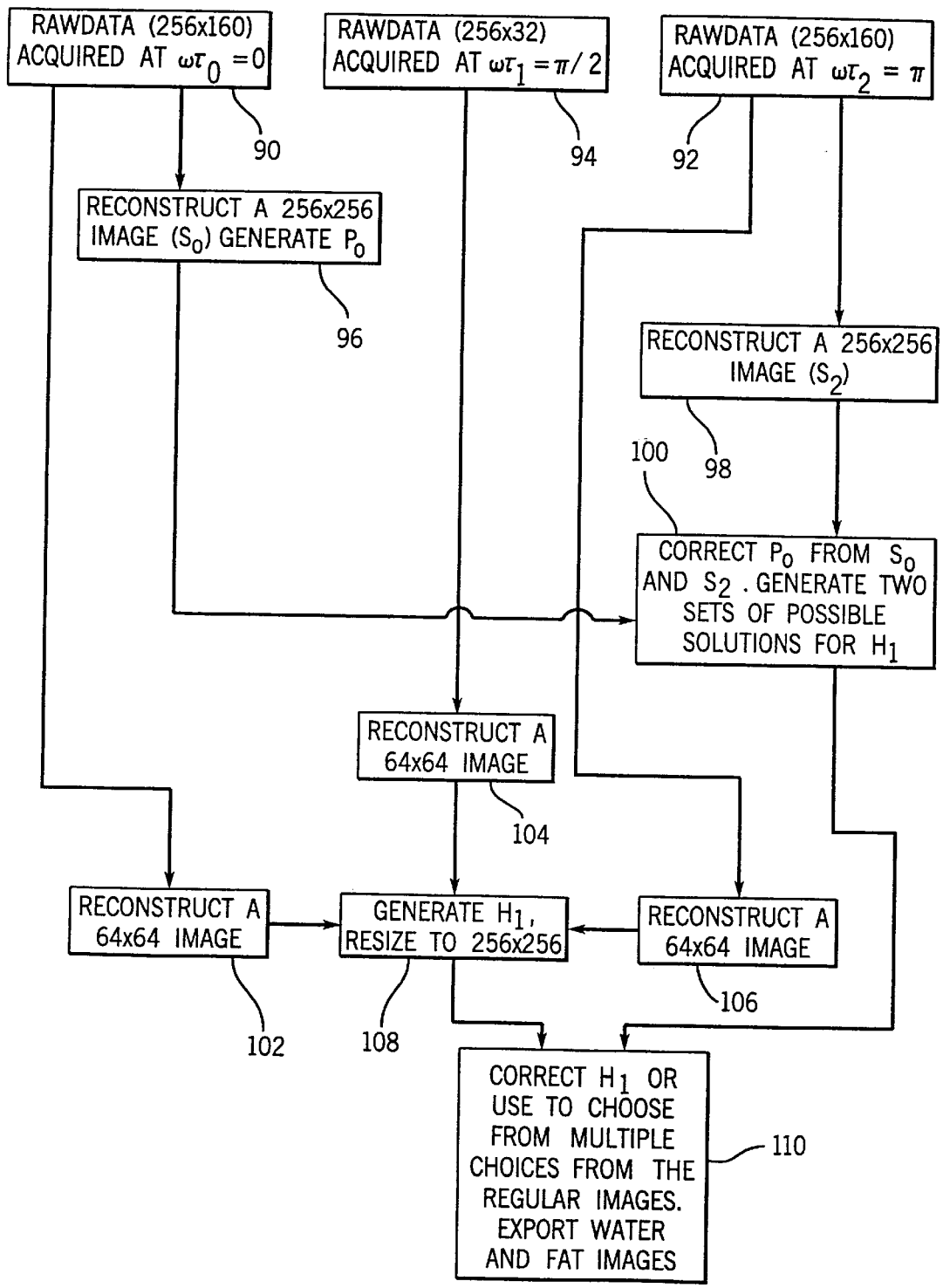
FIG. 4 is a flowchart of the processing steps in another embodiment of the present invention for water and fat separation.

Referring now to FIG. 4, the data processing steps are shown for a Two NEX embodiment for the improved water and fat separation MR imaging method and system of the present invention. First, two full resolution MR image data sets are acquired, one with the water and fat vectors aligned, 90, and another with the water and fat vectors opposed, 92. Another data set is acquired at a low-resolution where the water and fat vectors are phase shifted 90° at 94. A 256×256 image is constructed at 96 and 98 for each full resolution data acquisition 90, 92. In step 96, the phase factor $P_0$ is calculated and smoothed, and used to correct the phase factors from the two full resolution images, then two sets of possible solutions for the phase factor $H_1$ are generated, 100. Three low-resolution images are constructed 102, 104, and 106 for each of the data acquisitions 90, 94, and 92 using only the corresponding central k-space data. The three low-resolution images are then used to generate the phase factor $H_1$ according to the procedures detailed in FIG. 3, which in turn is resized to the full-resolution and smoothed at 108. Finally, this smoothed $H_1$ image at 108 can either be directly applied to images from 98, or used as a guide in choosing from the two possible sets of solutions for $H_1$ from 100. If the later approach is taken, a new $H_1$ is generated and smoothed for use in the correction of $S_2$ at 98. In both cases, the water and fat images are exported as the real and imaginary parts of the sum and difference of the complex images $S_0$ and $S_2$ and $P_0$ and $H_1$ correction.

Yet another embodiment is an extension of that shown in FIGS. 2 and 4 wherein a Three NEX imaging time system and method for improved water and fat separation using a set of low-resolution MR images is disclosed. In this case, a complete se of three MRI echoes are collected at the regular resolution. Similarly however, phase error determination is achieved from reconstructing three low-resolution images.

As previously described, the three low-resolution images are reconstructed by using only the central k-space portion of the raw data. The low-resolution phase errors thus obtained, can then be used either for direct phase error correction, or for guiding a binary choice that is available from the regular resolution images.

Detailed Theory

Generally, the frequency spectrum of water and fat in a given pixel can be represented with two δ-functions of amplitudes W and F, respectively. If the transverse relaxation during a short time interval of a few milliseconds is ignored, the complex MR signal $S_n$ after Fourier transform (FT) for the pixel from the n-th sampling at a time point $t_n$ can be expressed as follows (7):

$$S_n = (W + F e^{i\omega t_n}) e^{i(\omega_0 t_n + \phi_0)} \quad [1]$$

$$= (W + F C_n) H_n P_0 \quad [2]$$

In Eqns. [1] and [2], $C_n \equiv e^{i\omega t_n}$, $H_n \equiv e^{i\omega_0 t_n}$, $P_0 \equiv e^{i\phi_0}$, and $t_n$ is the shift of the center of the data acquisition window from the time when the water and fat magnetization vectors are aligned in phase. Further, $\omega$ is the chemical shift difference between water and fat, $\omega_0$ is the frequency offset associated with the field inhomogeneity, and $\phi_0$ is a time-independent phase offset.

Successful water and fat imaging is equivalent to obtaining the correct solution of F and W for all imaging pixels from the signals expressed in Eqns. [1] and [2]. Mathematically, $C_n$ is known quantity because $\omega$ is known a prior (ca. 3.5 ppm) and $t_n$ is controlled by data acquisition timing. The phase factors $P_0$, and especially $H_n$, however, are generally not known and are the major source of challenge, the latter being a variable not only a spatial location but also of data acquisition timing. Because of the nonlinear operation associated with forming magnitude of a complex variable, the phase factors $P_0$ and $H_n$ are eliminated in the conventional magnitude reconstruction, and as a result no unique solution of F and W is possible. The situation can be illustrated in a two-point sampling case where $C_n$ is chosen as 1 and −1 respectively, and the intensity of the corresponding magnitude images is as follows:

$$|S_0| = W + F \quad [3]$$

$$|S_1| = |W - F| \quad [4]$$

Because of the absolute sign in Eqn. [4], two different solutions are possible depending on whether water or fat is dominant (W>F, or otherwise). To circumvent the ambiguity and make a physical choice, it is essential to go back to Eqn. [2] and to determine the phase factors $P_0$ and $H_n$.

In the original Dixon technique, data for which water and fat magnetizations are parallel ($\omega t_0 = 0$, $C_0 = 1$) and anti-parallel ($\omega t_1 = \pi$, $C_1 = -1$) are collected. If the field is perfectly homogeneous ($\omega_0 = 0$), the two complex images after FT can be expressed in the following two equations:

$$S_0 = (W + F) e^{i\phi_0} \quad [5]$$

$$S_1 = (W - F) e^{i\phi_0} \quad [6]$$

Instead of forming the magnitude, the two complex images are directly added and subtracted to yield separate water and fat images. It is noted that the constant phase offset $\phi_0$ may vary spatially but does not affect the water and fat separation in this case. Clearly, when the field is not homogeneous ($\omega_0 \neq 0$), the decomposition will be incorrect, leading to an admixture of the two species in the final images.

The determination of $\omega_0$ or $H_n$ generally requires additional collection of data at different $t_n$. Several schemes have been proposed, and most are aimed at determining the phase values $\Psi_n (= \omega_0 t_n, n = 0, 1, 2 \ldots )$. In one approach, three data sets $S_0$, $S_1$ and $S_2$ are collected with $\omega t_n = 0$, $\pi 2\pi$, respectively. The additional measurement at $\omega t_2 = 2\pi$ is mainly used for determining the phase errors as follows:

$$2\psi_1 = \psi_2 = \arg\left(\frac{S_2}{S_0}\right) \quad [7]$$

Although generally less robust, the same phase information can also be directly obtained from only two data sets. For example, as long as W≠F, the two point measurements at $\omega t_0 = 0$ and $\omega t_1 = \pi$ allow for phase determination from the following relationship:

$$2\psi_1 = \arg\left[\left(\frac{S_1}{S_0}\right)^2\right] \quad [8]$$

In Eqns. [7] and [8], the operation represents taking the phase of its complex component. Unfortunately, the phase values as given in Eqns. [7] and [8] are only determined within the range of $-\pi$ to $\pi$. Possible phase-aliasing, if uncorrected, will result in image artifacts with reversed water and fat identification. Although seemingly trivial, correction of phase-aliasing (phase unwrapping) is a very challenging problem. To date, it still lacks a general and reliable solution and failure is often caused by the presence of pixels with low SNR or image artifacts (such as from motion) and by the possibility of disconnected tissues in the image.

In a three-point asymmetric sampling scheme for water and fat separation, three data sets are collected with the data acquisition timing chosen such that $\omega t_n$ in Eqn. [1] is equal to 0, $\alpha$ and $2\alpha$. Here $\alpha$ is selected to be a general angle which is not equal to a multiple of $\pi$:

$$S_0 = (W + F) P_0 \quad [9]$$

$$S_1 = (W + C_1 F) P_0 H_1 \quad [10]$$

$$S_2 = (W + C_1^2 F) P_0 H_1^2 \quad [11]$$

In Eqns. [9–11], $C_1 = e^{i\alpha}$, $P_0 = e^{i\phi_0}$ and $H_1 = e^{i\omega_0 t_1}$. Defining two new complex variables W' and F' whose magnitudes are equal to W and F, respectively:

$$W' = W P_0 H_1 \quad [12]$$

$$F' = F C_1 P_0 H_1 \quad [13]$$

Substituting Eqns. [12–13] into Eqns. [9–11], the following two sets of complex solutions can be derived in terms of the three complex images $S_0$, $S_1$, and $S_2$:

$$W_1' = \frac{S_1}{2} + \frac{\sqrt{(C_1 + 1)^2 S_1^2 - 4 C_1 S_0 S_2}}{2(C_1 - 1)} \quad [14]$$

$$F_1' = \frac{S_1}{2} - \frac{\sqrt{(C_1 + 1)^2 S_1^2 - 4 C_1 S_0 S_2}}{2(C_1 - 1)}$$

-continued $$W'_2 = \frac{S_1}{2} - \frac{\sqrt{(C_1 + 1)^2 S_1^2 - 4C_1 S_0 S_2}}{2(C_1 - 1)}$$ [15]

$$F'_2 = \frac{S_1}{2} + \frac{\sqrt{(C_1 + 1)^2 S_1^2 - 4C_1 S_0 S_2}}{2(C_1 - 1)}$$

Although two sets of solutions are again possible in Eqns. [14] and [15], a physical choice can be made because the solutions are in complex form with different phase relationships and only one of them satisfies Eqns. [12] and [13]. If α is chosen to be π($C_1$=−1) as in the symmetric sampling, the relative phase information is forever lost. By breaking the sampling symmetry, it is possible to not only select the physical set of solutions, but also to identify which vector belongs to water and which vector belongs to fat—a task not possible for the symmetric sampling even if the phase values, as defined in Eqn. [7] or Eqn. [8], are determined and possible phase aliasing is successfully corrected.

In order to separate water and fat with the asymmetric sampling, it is therefore only necessary to have a well-defined relative phase between the two vectors. Such information is usually available for a large portion of image pixels. However, relative phase can be poorly-defined for pixels with low SNR or even become non-defined for pixels containing only a single spectral component. Under these circumstances, information from other neighboring pixels need to be introduced. This can be done by determining the phase values $\Psi_n (=\omega_0 t_n)$, which would require possible phase-unwrapping. Alternatively, it is only necessary and more reliable to determine $H_n \equiv e^{i\omega_0 t_n}$ because $H_n$ lies on a unit circle and is insensitive to phase wrapping.

A convenient way to determine $H_n$ is through an Orientation Vector Ô as defined below:

$$\hat{O} = W_s' + C_1^{-1} F_s'$$ [16]

where $W_s'$ and $C_1^{-1}$ represent one set of the two possible solutions as given in Eqns. [14] and [15]. If the correct choice is made, as for the pixels containing significant amount of both water and fat, the Orientation Vector is equal to $(F+W)P_0 H_1$ according to Eqns. [12–13] and thus parallel to $P_0 H_1$. With the incorrect assignment, the Orientation Vector would be equal to $(FC_1+WC_1^{-1})P_0 H_1$ and thus deviate from $P_0 H_1$ by an angle determined by $(FC_1+WC_1^{-1})$, which is equal to either π/2 or −π/2 in the case of α=π/2 ($C_1$=i). Since water and fat have been correctly separated for the pixels with appreciable amounts of both water and fat, the binary choice for the remaining pixels can therefore be made by comparing the angular difference, as defined below, of the two possible Orientation Vectors with that of the neighboring pixel in a region-growing process:

$$\gamma = \arctan^{-1}(\hat{O}(i) \cdot \hat{O}^*(j))$$ [17]

Here, i and j in the parentheses are the spatial index for the pixels of the corresponding vectors.

The process of region growing by comparing the angular differences as defined in Eqn. [17] can efficiently correct any mis-assignment of water and fat for pixels with poorly-defined phase relationships. Because of the noise or artifacts, from motion for example, it is necessary to apply the same process repeatedly by starting from different random seeds in order to generate clean images. The final choice on the water and fat identification was then made on a statistical basis. Since the region-growing process is history-dependent and the image matrix is quite large (typically 256×256), the power of an array processor can not be fully utilized and the total image reconstruction time is quite long. This problem is further exacerbated in a similar two-point asymmetric sampling scheme, by which the total imaging time can be reduced by one third.

This review of the existing methods indicates that the main reason for failures in water and fat separation is the presence of pixels with low SNR or artifacts. Besides, it is easier and more robust to correct phase errors through $H_n$ rather than $\Psi_n$ since the former lies on a unit circle and thus is not sensitive to phase wrapping. Finally, asymmetric sampling has an advantage over the symmetric sampling since it allows for direct separation of all the pixels with appreciable amounts of both water and fat on a pixel basis without the need for phase correction. This is shown in the (0, , 2α) scheme as described previously. Another possible scheme is to sample at (0,π/2,2π), which generates the following three data sets:

$$S_0 = (W+F) e^{i\phi_0}$$ [18]

$$S_1 = (W+iF) e^{i\phi_0} e^{i\phi}$$ [19]

$$S_2 = (W+F) e^{i\phi_0} e^{i4\phi}$$ [20]

While the constant phase factor $P_0 = e^{i\phi_0}$ can be directly determined from Eqn. [18], Eqns. [19] and [20] determine only the value of $$e^{i4\phi} = \frac{S_2}{S_0}.$$

Since 4φ is likely to be aliased (±2nπ, where n=0, 1, 2 . . . ), φ has the uncertainty of ±nπ/2 prior to phase unwrapping. However, the uncertainty does not change the phase relationship of the two components, and as a result, correct water and fat separation can be obtained from Eqns. [19] and [20] directly.

While the (0, π/2, 2π) scheme requires longer time span than the (0, α, 2α) scheme, it has the advantage in that the phase values determined from Eqns. [19] and [20] are independent of the relaxation effects. In both cases, a good definition of the relative phase of the two components is required. For pixels with low SNR or pixels with a single component, phase factor correction can be made by a similar region growing process as described previously.

In any case, the use of asymmetric sampling (such as (0, α, 2α) or (0, π/2, 2π)) and correction of phase factors $H_n$ rather than $\Psi_n$ lead to a higher reliability in water and fat separation than the traditional symmetric sampling and phase-unwrapping. Such approaches, however, do not address the issue of the long imaging and reconstruction times in comparison to the regular imaging.

The present invention uses a set of low-resolution images collected with asymmetric sampling for correcting phase variations $P_0$ and $H_n$ in the regular image in Eqn. [1]. Such correction is feasible because in actual MR images, the phase factors $P_0$ and $H_n$, although critical to the success of water and fat separation and may be large over the entire image FOV, are both smoothly-changing functions on the scale of image pixels. Because low-resolution images are acquired in a reduced imaging time and they possess higher SNR, the artifacts, such as from motion, are less severe and the detrimental effects of noise in the regular image are largely mitigated. Both contribute to more robustness in the water and fat separation and shorter total image reconstruction time.

While water and fat can in principle be separated in a single NEX imaging by making use of the quadrature nature of MR sampling, it is in practice only possible when all the phase errors have been corrected. Previously, phase error correction has been carried out by using low-order polynomial fitting. However, such an approach is model-dependent and requires either data from separate experiments or data from multi-acquisitions. With the present invention, phase errors are determined on an image basis, and as a result, more reliable water and fat separation can be achieved with only a small increase in imaging time relative to the regular imaging.

The following is a description of two possible implementations: one that requires close to one NEX of the regular imaging time and another that requires close to two NEX of the regular imaging time. Although several sampling schemes such as $(0, \pi/2, 2\pi)$ are possible, the $(0, \alpha, 2\alpha)$ scheme with $a=\pi/2$ was chosen because of its ease of implementation and because of its slightly shorter total time shift in echo centering.

One NEX Implementation

In the One NEX implementation, data with a regular matrix size (for example, 256×160) at $\omega t_1=\pi/2$ are obtained along with those for two low-resolution images (typically 256×32, where the smaller number represents the phase encoding steps) at $\omega t_0=0$ and $\omega t_2=\pi$, respectively. As previously described, the image processing steps are illustrated in the flowchart of FIG. 2. To determine $P_0$, a 256×256 image is reconstructed from the data at $\omega t_0=0$ after zero-filling and Fermi-windowing. This image is used to approximate $P_0$ after being smoothed with a boxcar average (for example, 7×7 window) and subsequent normalization of the magnitude. To determine $H_1$, three low-resolution images (typically 64×64) are reconstructed from the three (64×32) data sets that are available after zero-filling and Fermi-windowing. The raw data in the high frequency range for all three data sets, as well as data in the high phase-encoding range at $\omega t_1=\pi/2$ are discarded in order to improve SNR).

From the low-resolution image at $\omega t_0=0$, a low-resolution $P_0$ is first calculated and then corrected from all three low-resolution images. Afterwards, an initial selection of the two possible solutions for water and fat is made based on the phase relationship of the water and fat vectors as defined in Eqns. [14] and [15]. In the second step, a region growing algorithm is used for correction of potential mis-assignment of water and fat after the first step.

The flowchart for the entire region-growing process is illustrated in FIG. 3. Specifically, a pixel is first randomly selected as a seed and the four neighboring pixels are checked one at a time by comparing the angular differences, as defined in Eqn. [17], of the two possible orientation vectors of the pixel with that of the seed. The binary choice between the two possible solutions is based on which angular differences is smaller since the correct assignment of water and fat for two neighboring pixels will have their Orientation Vectors nearly aligned. Following the check, the visited pixel is usually used as a new seed for the next round of growth on a FIFO (first-in-first-out) basis. To prevent growth in the noise, a threshold of +/−15° is set for the relative angle of the Orientation Vectors between any two neighboring pixels. The possibility of choosing a seed with an incorrect water and fat assignment at the beginning of the process is monitored by a reversal counter, which is defined as the difference between the total number of non-reversals and the total number of reversals from the choices made before the region growing process. If the reversal counter associated with a given process becomes negative, the growth is aborted and a new seed is chosen randomly for the next process.

After all pixels in the image are visited, the low-resolution orientation vector field is re-sized to the regular matrix (256×256) for another boxcar averaging (7×7 window). Possible remaining incorrect assignments are reversed by comparing the dot products of the Orientation Vector with the average Orientation Vector for the same pixel. The final phase factor $H_1$ is then obtained by normalizing the new Orientation Vector after another round of boxcar averaging (7×7 window).

Once $P_0$ and $H_1$ are available, they are used to correct the complex image at $\omega t_1=\pi/2$. The real and the imaginary parts of the regular image after phase correction are then exported as the desired water and fat images.

Two NEX Implementation

In a Two NEX implementation, data for two images with regular matrix size (for example 256×160) are collected at $\omega t_0=0$ and $\omega t_2=\pi$, respectively, along with that of a low-resolution image (256×32) at $\omega t_1=\pi/2$. As previously described, the image processing steps are illustrated in the flowchart in FIG. 4. Specifically, $P_0$ is obtained by smoothing the image reconstructed from the data at $\omega t_0=0$ after Fermi-windowing. The same strategy of using three low-resolution images as in the One NEX implementation is used to generate an approximate $H_1$, which can then be used either directly for correcting the image at $\omega t_2=\pi$, or as an aid in choosing between the two possible solutions of $H_1$ from the two regular images at $\omega t_0=0$ and $\omega t_2=\pi$. If the latter option is followed, the vector field associated with $H_1$ is averaged to generate a smooth $H_1$. As a final step, water and fat images are taken as the real parts of the sum and the difference of the two complex images at $\omega t_0=0$ and $\omega t_2=\pi$ after phase correction.

Three NEX Implementation

In a Three NEX implementation, data for three regular matrix size images (for example 256×256) are collected at $\omega t_0=0$, $\omega t_1=\pi/2$, and $\omega t_2=\pi$. Again, three low-resolution images are reconstructed at $\omega t_1=\pi/2$, and $\omega t_2=\pi$ using only the corresponding central k-space data for phase error correction, as previously described. The only essential difference between the previously described Two NEX implementation, is the final step wherein a Three NEX implementation, three full resolution images are reconstructed at $\omega t_0=0$, $\omega t_1=\pi/2$, and $\omega t_2=\pi$, respectively. $P_0$ is removed from all three images and after the formation of two possible sets of orientation vectors using Eqns. [14–16], a comparison of the angles of the orientation vectors with that of $H_1$ is made, and the one that is chosen is the one with the closer angular proximity to that of $H_1$. The orientation vector is smoothed using a boxcar average and $H_1$ is removed from all three images, whereafter the scaler components for the water and fat vectors are solved using equations [9–11]. Lastly, optimal averaging can be conducted for the best SNR. It is noted that although the use of a Three NEX approach results in a longer scan time than a Two NEX or a One NEX, each additional NEX results in higher quality SNR images. Which of these application to use is understood to be an application decision.

It is further theorized that the above-described system and method can equivalently be applied to a two-point sampling scheme where data sets are collected asymmetrically, such as at 0 and 90°. The use of low-resolution images for phase error correction would be equivalently implemented with two resolution images.

It has been found that the present invention yields results with an average time of the actual processing per slice, excluding input and output, in less than ten seconds without the use of array processing and program optimization. The image processing itself is fully automatic without any need for manual interventions.

Correct separation of the two species is expected as long as the phase variation due to the field change between the neighboring pixels is much smaller than that due to the chemical shift difference between water and fat (ca. 3.5 ppm). Such requirement is usually a fairly conservative one because of the generally small susceptibility difference between different types of tissues and the long-range nature of the underlying magnetic forces. Also note that in the Two NEX approach, this requirement is used only for ensuring that no reversed water and fat identification occurs and that the actual phase factors are determined from the two regular images. In the One NEX approach, the deviation $\delta\Phi$ (where $\Phi=\phi_0+\Psi_1$) from the actual phase values will in general lead to an admixture (but not reversal) of the two species in the separated images, which is quantifiable by the following two equations:

$$W_a = W \cos(\delta\Phi) + F \sin(\delta\Phi) \quad [21]$$

$$F_a = W \sin(\delta\Phi) + f \cos(\delta\Phi) \quad [22]$$

In the above two equations, $W_a$ and $F_a$ are the apparent water and fat intensity. Accordingly, a deviation °/−5° in $\delta\Phi$ will result in a contamination of less than 10%, which should be tolerable in most of the applications. Ultimately, an optimized resolution can be selected for the low-resolution images depending on the applications involved, imaging time, resolution and the severity of the magnet inhomogeneity. The resolution needed in the low-resolution images could also be dependent on which sequence the technique is implemented in. Gradient echo sequence, for example, is more susceptible to phase errors than spin echo, and therefore would require higher resolution to yield the same quality for the phase representation.

Using low-resolution images for determining phase variations and exporting the real or imaginary parts as water or fat images have another advantage of improving noise performance for low SNR regions. By forming the magnitude image, noise from both real and imaginary channels contribute to the final image. When the phase is determined from the low-resolution and thus high-SNR images, part of the noise is effectively suppressed. For this reason, the One NEX approach is expected to provide better actual SNR performance in the water or fat images than a regular one NEX magnitude image. Similarly, the Two NEX implementation is expected to offer better actual SNR performance than a regular Two NEX magnitude image.

It is noted that an underlying assumption of all Dixon-type techniques is that the spectra of both water and fat can be represented with two $\delta$-functions. In reality, the relaxation will generally broaden the spectral peaks, and for fat, multiple peaks are present because of its complex chemical structure. The deviation from the ideal case could in principle lead to errors in the water and fat separation. If the shape of the spectra of both components is known exactly however, these errors can easily be corrected by a straightforward modifications of Eqns. [9–11]. Such modifications may be important, especially in gradient echo implementations, since phase dispersions during the entire echo time (TE) is not refocused.

The present invention has been described in terms of the preferred embodiment, and it is recognized that equivalents, alternatives, and modifications, aside from those expressly stated, are possible and within the scope of the appending claims.

I claim:

1. An MR imaging method for improved water and fat separation comprising the steps of:
   obtaining at least three MR image data sets, two of the MR image data sets are obtained at a first image resolution, and a third is obtained at another image resolution, wherein at least one MR image data set is acquired at an image resolution higher than the image resolution of at least one other MR image data set and provides a regular matrix size image;
   constructing three low-resolution images from the three MR image data sets; and
   creating a low-resolution phase factor map from the three low-resolution images to correct phase errors in the regular matrix size image provided by the MR image data set obtained at the higher image resolution.

2. The method of claim 1 wherein the MR image data set obtained at the higher image resolution is acquired where water and fat vectors are phase-shifted by approximately 90°.

3. The method of claim 2 wherein at least two MR image data sets are acquired at a lower image resolution and where one lower image resolution MR image data set has water and fat vectors phase-shifted by approximately 0° and the other has water and fat vectors phase-shifted by approximately 180°.

4. The method of claim 1 wherein at least two MR image data sets are obtained at the higher image resolution, wherein one is acquired where water and fat vectors are phase-shifted by approximately 0°, and another is acquired where water and fat vectors are phase-shifted by approximately 180°.

5. The method of claim 4 wherein the third MR image data set is acquired at a lower image resolution and where water and fat vectors are phase shifted by approximately 90°.

6. The method of claim 1 wherein the higher image resolution provides the regular matrix size image of approximately 256×256 pixels.

7. The method of claim 1 wherein another image resolution is a fraction of the higher image resolution such that MR image data sets are acquirable in a fraction of the time of the MR image data sets acquired at the higher image resolution.

8. The method of claim 1 wherein each of the three MR image data sets are obtained having water and fat vectors at differing phase angles for asymmetrical sampling.

9. The method of claim 1 further comprising the step of determining low-resolution phase factors for all pixels having appreciable amounts of water and fat on a per pixel basis from the three low-resolution images.

10. The method of claim 9 further comprising the step of correcting phase errors in the regular matrix size image with the determined phase factors.

11. The method of claim 9 wherein two of the MR image data sets are obtained at the higher resolution and further comprising the step of making a binary decision between multiple solutions determined from the two MR image data sets obtained at the higher resolution based on the low-resolution phase factors.

12. An MR imaging method for improved water and fat separation comprising the step of:
   obtaining a first and second MR image at a first resolution;
   obtaining a third MR images at a second resolution, wherein the second resolution is lower than the first resolution of the first MR image;
   constructing three low-resolution images from the first, second, and third MR images; and creating a low-resolution phase factor map from the three low-resolution images for correcting phase errors in the first MR image.

13. The method of claim 12 wherein the first MR image is taken where water and fat vectors are phase-shifted by 90°.

14. The method of claims 12 wherein one of the first and second MR images is taken where water and fat vectors are opposed and another is taken where water and fat vectors are aligned.

15. An MR imaging method for improved water and fat separation comprising the step of:
   obtaining a first MR image at a first resolution;
   obtaining second and third MR images at a second resolution, wherein the second resolution is lower than the first resolution of the first MR image;
   constructing three low-resolution images from the first, second, and third MR images; and
   creating a low-resolution phase factor map from the three low-resolution images for correcting phase errors in the first MR image.

16. The method of claims 15 wherein one of the first and second MR images is taken where water and fat vectors are opposed and another is taken where water and fat vectors are aligned.

17. The method of claim 15 wherein the third MR image is taken where water and fat vectors are phase-shifted by 90°.

18. A system to improve water and fat separation in an MR image, the system comprising a processor programmed to:
   obtain at least three MR image data sets, two of the MR image data sets are obtained at a first image resolution, and a third is obtained at another image resolution, wherein at least one MR image data set is acquired at an image resolution higher than the image resolution of at least one other MR image data set and provides a regular matrix size image;
   construct three low-resolution images from the three MR image data sets; and
   create a low-resolution phase factor map from the three low-resolution images to correct phase errors in the regular matrix size image provided by the MR image data set obtained at the higher image resolution.

19. The system of claim 18 wherein the MR image data set obtained at the higher image resolution is acquired where water and fat vectors are phase-shifted by approximately 90° and wherein at least two MR image data sets are acquired at a lower image resolution and where one lower image resolution MR image data set has water and fat vectors phase-shifted by approximately 0° and the other has water and fat vectors phase-shifted by approximately 180°.

20. The system of claim 18 wherein at least two MR image data sets are obtained at the higher image resolution, one where water and fat vectors are phase-shifted by approximately 0°, and another where water and fat vectors are phase-shifted by approximately 180°, and wherein the third MR image data set is acquired at a lower image resolution where water and fat vectors are phase shifted by approximately 90°.

21. An MR imaging method for improved water and fat separation comprising the steps of:
   obtaining at least MR image data sets having water and fat magnetization vectors taken at an echo time offset such that resulting water and fat magnetization vectors have a phase angle therebetween of approximately 90°, at least one of the at least two MR image data sets is acquired at a regular image resolution;
   constructing two low-resolution images from the at least two MR image data sets;
   deriving water and fat representations from the at least two low-resolution images; and
   creating a low-resolution phase factor map from the at least two low-resolution images to correct phase errors in the regular matrix size image provided by the MR image data set obtained at the regular image resolution.

22. The method of claim 21 wherein the at least two MR image data sets are each acquired at a first image resolution, each providing a regular matrix size image.

23. The method of claim 21 further comprising obtaining a third MR image data set, wherein each MR image data set has water and fat magnetization vectors taken at an echo time offset such that resulting water and fat magnetization vectors have a relative phase of 0, $\alpha$, $2\alpha$ therebetween, where $\alpha$ is not 180°.

24. The method of claim 21 wherein the at least two MR image data sets are acquired at a first image resolution, and a third is obtained at another image resolution, and one of the MR image data sets is acquired at an image resolution higher than the image resolution of at least one other MR image data set and provides a regular matrix size image.

25. The method of claim 21 wherein the step of constructing two low-resolution images from the at least two MR image data sets are each constructed with a Fourier transform.

26. The method of claim 21 further comprising calculating an orientation vector to determine a time dependent phase factor according to the equation:

$$\hat{O} = W_x' + C_1^{-1} F_s'$$

where $W_s'$ and $C_1^{-1}$ represent one set of two possible solutions for deriving water and fat representations.

27. The method of claim 21 further comprising correcting water and fat representation orientation by a region growing technique in which angular differences in at least two possible orientation vectors are compared with neighboring pixels, the region growing technique defined by:

$$\arctan^{-1}(\hat{O}(i) \cdot \hat{O}^*(j))$$

wherein i and j are the spatial indices for neighboring pixels.

28. An MR imaging method for improved water and fat separation comprising the steps of:
   1) acquiring k-space data, wherein
      a. if one NEX, acquiring one full-resolution data at $\omega t_1 = \pi/2$, one low-resolution at $\omega t_0 = 0$, and one low-resolution at $\omega t_2 = \pi$;
      b. if two NEX, acquire one full-resolution data at $\omega t_0 = 0$, one low-resolution at $\omega t_1 = \pi/2$, and one full-resolution at $\omega t_2 = \pi$;
      c. if three NEX, acquire one full-resolution data at $\omega t_0 = 0$, one full-resolution at $\omega t_1 = \pi/2$, and one full-resolution at $\omega t_2 = \pi$;
   2) constructing three low-resolution images at $\omega t_0 = 0$, $\omega t_1 = \pi/2$, $\omega t_2 = \pi$ using only the corresponding central k-space data, wherein each is represented as $S_0$, $S_1$ and $S_2$,
   3) determining a phase factor $P_0$ from $S_0$ and removing $P_0$ from three low-resolution images;
   4) calculating two possible sets of solutions for F' and W' according to:

$$W_1' = \frac{S_1}{2} + \frac{\sqrt{(C_1+1)^2 S_1^2 - 4C_1 S_0 S_2}}{2(C_1-1)}$$

$$F_1' = \frac{S_1}{2} - \frac{\sqrt{(C_1+1)^2 S_1^2 - 4C_1 S_0 S_2}}{2(C_1-1)}$$

$$W_2' = \frac{S_1}{2} - \frac{\sqrt{(C_1+1)^2 S_1^2 - 4C_1 S_0 S_2}}{2(C_1-1)}$$

$$F_2' = \frac{S_1}{2} + \frac{\sqrt{(C_1+1)^2 S_1^2 - 4C_1 S_0 S_2}}{2(C_1-1)}$$

where $C_1 = e^{i\alpha}$, 5) calculate a relative phase of the two sets of solutions F' and W' and choosing one solution for which F' has a leading phase as a correct solution;

6) if an amplitude of one of two components (|F'| and |W'|) is less than 5% of the other, assigning that component as water component;

7) forming an orientation vector as defined in:

$$\hat{O} = W_s' + C_1^{-1} F_s'.$$

8) calculating an average orientation vector and comparing a direction of the orientation vector with that of the average orientation vector; and if the difference is within approximately +/−90°,
   a. maintaining the orientation vector, otherwise,
   b. replacing the orientation vector with a replacement orientation vector by interchanging F' and W'; and 9) resizing the orientation vector to a full-resolution image.

29. The method of claim 28 further comprising the step of calculating an average orientation vector by boxcar averaging, and determining a time average phase factor $H_1$ from the averaged orientation vector.

30. The method of claim 28 further comprising the steps of, for a one Nex method:
   a. reconstructing a full resolution image at $\omega t_0 = 0$ and another full resolution image at $\omega t_1 = \pi/2$ using the acquired data;
   b. determining $P_0$ from the image $\omega t_0 = 0$ and removing it from the image at $\omega t_1 = \pi/2$;
   c. removing $H_1$ from the image at $\omega t_1 = \pi/2$; and
   d. assigning a final water and fat image by taking an absolute value of a real and imaginary parts of the image at $\omega t_1 = \pi/2$, respectively, after both $P_0$ and $H_1$ are removed.

31. The method of claim 28 further comprising the steps of, for a two Nex method:
   a) reconstructing a full resolution image at $\omega t_0 = 0$ and another full resolution image at $\omega t_2 = \pi$ using acquired data,
   b) determining $P_0$ from the image at $\omega t_0 = 0$ and removing it from both the image at $\omega t_0 = 0$ and the image at $\omega t_2 = \pi$;
   c) determining $H_1^2$ and comparing a direction of $H_1^2$ using a direction of $H_1$ as determined from Step 9, and if a difference is within +/−90°, maintaining $H_1^2$, otherwise, replacing it with $-H_1^2$;
   d) smoothing $H_1^2$ using boxcar averaging; and
   e) removing $H_1^2$ and deriving fat and water representations.

32. The method of claim 28 further comprising the steps of, for a three Nex method:
   a) reconstructing three full resolution images at $\omega t_0 = 0$, $\omega t_1 = \pi/2$, and $\omega t_2 = \pi$;
   b) removing $P_0$ from the three full resolution images;
   c) forming two possible sets of orientation vectors;
   d) comparing angles of the orientation vectors with that of $H_1$ as determined at Step 9, and choosing one with a closest angular proximity to that of $H_1$;
   e) smoothing the orientation vector using boxcar averaging;
   f) removing $H_1$ from the three full resolution images;
   g) solving for W and F; and
   h) optimal averaging for a high signal to noise ratio.

33. The method of claim 28 further comprising the steps of:
   1) picking a random seed pixel and comparing a direction of the orientation vector of the random seed pixel with that of its four nearest neighboring pixels, and if
      a) a direction of the orientation vector of a neighboring pixel is within +/−15° of that of the random seed pixel, maintaining the orientation vector of the neighboring pixel and assigning that pixel as non-reversal and storing it in a stack of new seeds for subsequent growth;
      b) a direction of the orientation vector of the neighboring pixel is within +/−15 of an opposite of that of the random seed pixel, replacing the orientation vector of the neighboring pixel with a second orientation vector formed by interchanging F' and W', and assigning that pixel as reversed and storing it in the stack of new seeds for subsequent growth;
      c) a direction of the orientation vector of the neighboring pixel is outside the range of steps a) and b), maintaining the orientation vector of the neighboring pixel without storing this pixel into the stack of new seeds for subsequent growth;
      d) continuing until no further seed pixels are in the seed stack and aborting if more pixels are assigned reversed than pixels assigned non-reversed;
   and
   2) generating new random seeds and repeating Step 1) until a pre-defined total number is reached.

* * * * *

UNITED STATES PATENT AND TRADEMARK OFFICE
CERTIFICATE OF CORRECTION

PATENT NO. : 6,016,057
DATED : January 18, 2000
INVENTOR(S) : Jingfei Ma

It is certified that error appears in the above-identified patent and that said Letters Patent is hereby corrected as shown below:

Col. 1, line 34, change "ration" to - - ratio - -.

Col. 2, line 10, change "ration" to - - ratio - -.

Col. 3, line 26, change "computer" to - - component - -.

Col. 3, line 67, change "Gs" to - - Gx - -.

Col. 6, line 8, change "one" to - - non - -.

Col. 6, line 65, change "se" to - - set - -.

Col. 7, line 31, change "prior" to - - priori - -.

Col. 10, line 16, change "(0, , 2$a$)" to - - (0, $a$, 2$a$) - -.

Col. 12, line 37, after "at" insert - - $\omega t_0$=0, - -.

Col. 13, line 25, delete "°/-5°" and substitute therefore - - +/-5° - -.

Col. 15, line 64, after "least" insert - - two - -.

Col. 18, line 38, delete "+/-15" and substitute therefore - - +/- 15° - -.

Signed and Sealed this

Fifth Day of December, 2000

Attest:

Q. TODD DICKINSON

*Attesting Officer*    *Director of Patents and Trademarks*